US011973421B2

(12) United States Patent
Yoto

(10) Patent No.: US 11,973,421 B2
(45) Date of Patent: Apr. 30, 2024

(54) CIRCUIT MODULE INCLUDING METAL PLATE IN CONTACT WITH ELECTRODE PORTIONS

(71) Applicant: Murata Manufacturing Co., Ltd., Nagaokakyo (JP)

(72) Inventor: Yasuhiro Yoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 324 days.

(21) Appl. No.: 17/399,231

(22) Filed: Aug. 11, 2021

(65) Prior Publication Data

US 2021/0376720 A1     Dec. 2, 2021

Related U.S. Application Data

(63) Continuation of application No. PCT/JP2020/007214, filed on Feb. 21, 2020.

(30) Foreign Application Priority Data

Mar. 22, 2019   (JP) .................................. 2019-055287

(51) Int. Cl.
*H02M 3/07* (2006.01)
*H01G 4/228* (2006.01)
(Continued)

(52) U.S. Cl.
CPC .............. *H02M 3/07* (2013.01); *H01G 4/228* (2013.01); *H01G 4/38* (2013.01); *H01G 4/40* (2013.01)

(58) Field of Classification Search
CPC ........... H02M 3/07; H01G 4/228; H01G 4/38; H01G 4/40
(Continued)

(56) References Cited

U.S. PATENT DOCUMENTS 7,320,604 B2 *   1/2008   Ohtsuki ................. H05K 1/141
361/772
2007/0178729 A1 *   8/2007   Ohtsuki ................. H05K 1/141
439/108
(Continued)

FOREIGN PATENT DOCUMENTS

JP      2007-207802 A      8/2007
WO   2017/022284 A1      2/2017
(Continued)

OTHER PUBLICATIONS

Official Communication issued in International Patent Application No. PCT/JP2020/007214, dated May 19, 2020.

*Primary Examiner* — Yemane Mehari
(74) *Attorney, Agent, or Firm* — Keating & Bennett, LLP

(57) ABSTRACT

A circuit module includes a substrate, a DC/DC converter mounted on the substrate, and a capacitor including a pair of electrodes each including an upper electrode portion facing the second main surface, a lower electrode portion opposing the upper electrode portion, and a side-surface electrode portion connecting the upper electrode portion and the lower electrode portion. The circuit module includes metal plates connected to the substrate and exposed to the outside. The metal plates are in contact with the lower electrode portion and the side-surface electrode portion. The metal plates are in contact with the lower electrode portion and the side-surface electrode portion.

16 Claims, 6 Drawing Sheets

(51) Int. Cl.
*H01G 4/38* (2006.01)
*H01G 4/40* (2006.01)

(58) Field of Classification Search
USPC .......................................................... 323/282
See application file for complete search history.

(56) References Cited

U.S. PATENT DOCUMENTS

2009/0103272 A1* 4/2009 Watanabe .............. H05K 1/165
  361/748
2018/0145598 A1* 5/2018 Muto ..................... H01L 23/04
2018/0308627 A1 10/2018 Kato et al.

FOREIGN PATENT DOCUMENTS

| WO | 2017/134993 A1 | 8/2017 |
| WO | 2017/175513 A1 | 10/2017 |
| WO | 2017/183385 A1 | 10/2017 |

* cited by examiner

CIRCUIT MODULE INCLUDING METAL PLATE IN CONTACT WITH ELECTRODE PORTIONS

CROSS REFERENCE TO RELATED APPLICATIONS

This application claims the benefit of priority to Japanese Patent Application No. 2019-055287 filed on Mar. 22, 2019 and is a Continuation Application of PCT Application No. PCT/JP2020/007214 filed on Feb. 21, 2020. The entire contents of each application are hereby incorporated herein by reference.

BACKGROUND OF THE INVENTION

1. Field of the Invention

The present invention relates to a circuit module.

2. Description of the Related Art

Circuit modules have been known in which capacitors are used as electrode terminals (see, for example, Japanese Unexamined Patent Application Publication No. 2007-207802). The use of a capacitor as the electrode terminal of a circuit module contributes to miniaturization of the module, because the capacitor can be used as an element in the circuit module and a component defining and functioning as a terminal.

If such a circuit module is applied to, for example, a DC/DC converter circuit, a case is considered where an input-side capacitor and an output-side capacitor in the DC/DC converter circuit are used as electrode terminals. However, the current of a DC/DC converter circuit depends on the thickness of the electrode of a capacitor. In the case of a DC/DC converter that handles a large current, there is a problem that the amount of heat generated by a capacitor becomes large.

SUMMARY OF THE INVENTION

Preferred embodiments of the present invention provide circuit modules in each of which heat generation in a capacitor is able to be reduced or prevented.

A circuit module according to a preferred embodiment of the present disclosure includes a substrate including a first main surface and a second main surface, a DC/DC converter circuit mounted on the first main surface of the substrate, a capacitor mounted on the second main surface of the substrate and including a pair of electrodes each including a first electrode portion, a second electrode portion, and a third electrode portion, the first electrode portion facing the second main surface and being connected to the DC/DC converter circuit via the substrate, the second electrode portion facing opposite from the first electrode portion, the third electrode portion connecting the first electrode portion and the second electrode portion, and a metal plate connected to the substrate, that is in contact with the second electrode portion and the third electrode portion, and that is at least partly exposed to an outside.

With this configuration in which a metal plate is connected to the substrate, is in contact with the second electrode portion and the third electrode portion of the capacitor, and is at least partly exposed to an outside, the metal plate is able to be used as a terminal for connection to the outside. As a result of the metal plate being in contact with the second electrode portion, an allowable current can be increased as compared with the case where the capacitor is used as a terminal. Accordingly, the heat generation of the capacitor is able to be reduced or prevented.

With circuit modules according to preferred embodiments of the present invention, heat generation in capacitors in each of the circuit modules is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
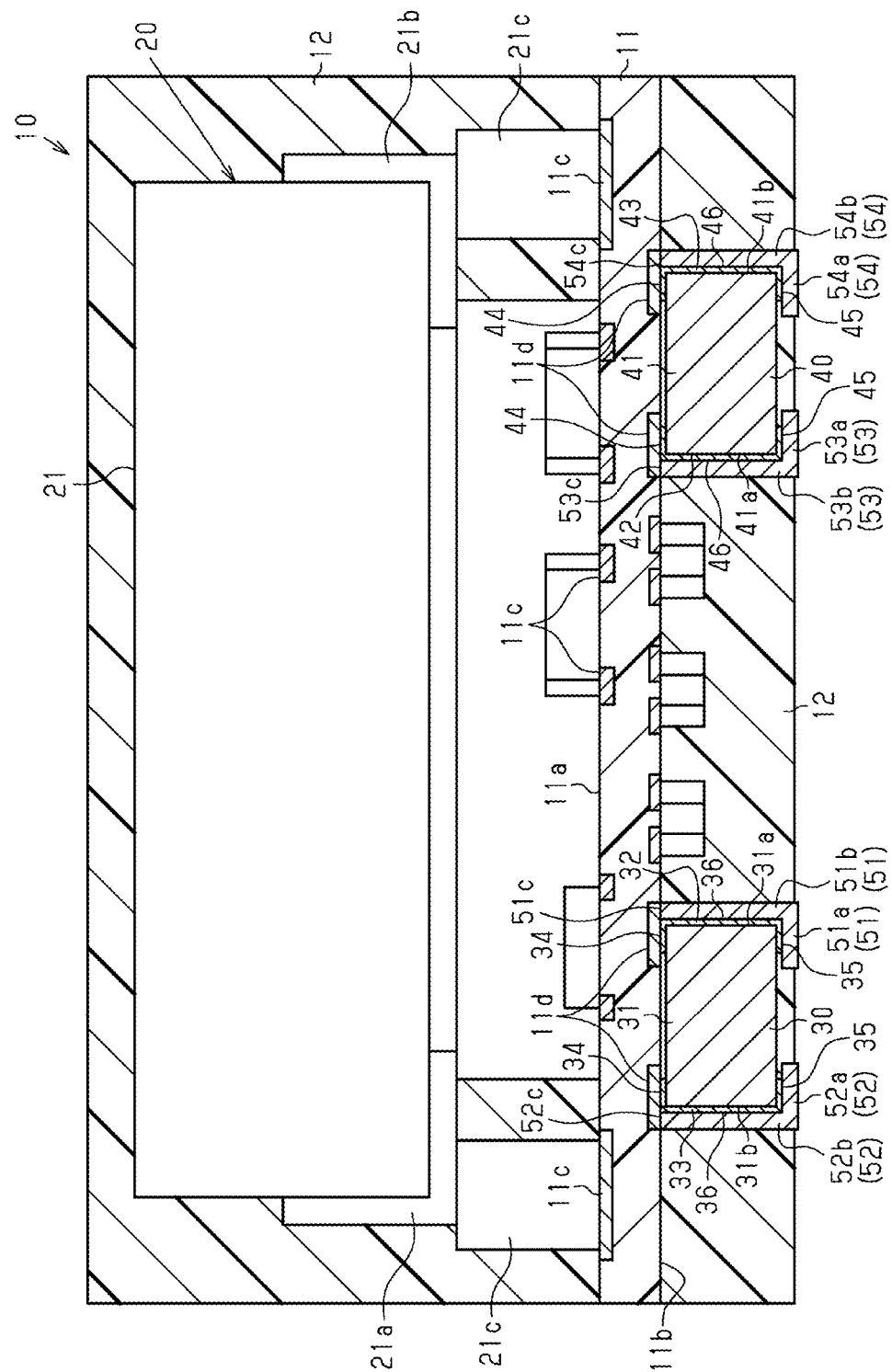
FIG. 1 is a cross-sectional view of a circuit module according to a first preferred embodiment of the present invention.

Preferred embodiments of the present invention will be described below with reference to the accompanying drawings. The preferred embodiments to be described below exemplify configurations and methods according to the present invention, and do not limit a material, a shape, a structure, an arrangement, a dimension, and the like of each component. Various modifications may be made to the following preferred embodiments.

Note that some components may be illustrated in an enlarged manner in the accompanying drawings for ease of understanding. The dimensional ratios of the components may be different from the dimensional ratios of actual components or may differ between those in the drawings. In a cross-sectional view, hatching may be omitted for some of the components for ease of understanding.

First Preferred Embodiment

As illustrated in FIG. 1, a circuit module 10 according to a first preferred embodiment of the present invention includes a substrate 11, a DC/DC converter circuit 20 including an inductor 21, a plurality of capacitors 30 and 40, and a sealing resin 12. The circuit module 10 according to the present preferred embodiment is a power module for stepping up or down a voltage using the DC/DC converter circuit 20.

As illustrated in FIG. 1, the substrate 11 is plate-shaped and includes via conductors and various wiring electrodes provided therein. For example, the substrate 11 has a rectangular or substantially rectangular shape when viewed in plan. The substrate 11 includes a first main surface 11a and a second main surface 11b facing opposite from the first main surface 11a. On or in the first main surface 11a, connection pins 21c that support the inductor 21 and connection electrodes 11c that make connections to various electronic components are provided.

In the second main surface 11b, connection electrodes 11d that make connections to the capacitors 30 and 40 and various electronic components are provided.

Figure 3:
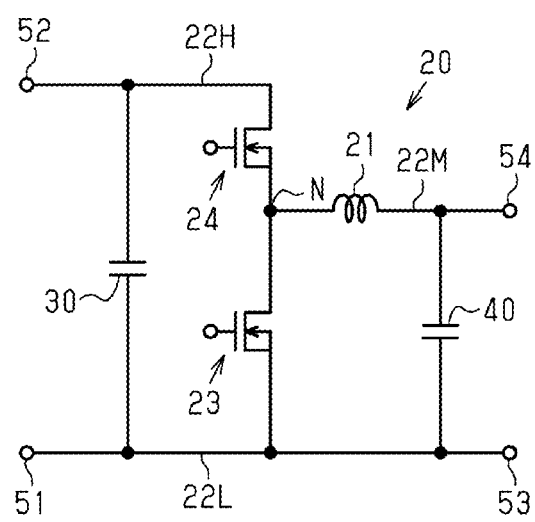
FIG. 3 is a circuit diagram of a DC/DC converter circuit according to a preferred embodiment of the present invention.

As illustrated in FIG. 3, a DC/DC converter circuit 20 includes a first electric wire 22L, a second electric wire 22H, and a third electric wire 22M. The first electric wire 22L, the second electric wire 22H, and the third electric wire 22M include, for example, via conductors and wiring electrode provided in the substrate 11.

In the DC/DC converter circuit 20, two switching elements 23 and 24 are connected between the first electric wire 22L and the second electric wire 22H. The two switching elements 23 and 24 are connected in series in this order from the side of the first electric wire 22L that is a low potential side. A connection node N between the switching elements 23 and 24 is connected to the third electric wire 22M. The third electric wire 22M is connected to a first terminal 42 on one side of the capacitor 40 via the inductor 21. A second terminal 43 on the other side of the capacitor 40 is connected to the first electric wire 22L. That is, the capacitor 40 is connected between the first electric wire 22L and the third electric wire 22M. The first electric wire 22L and the third electric wire 22M define a portion of the connection electrode 11d provided in the second main surface 11b.

A first terminal 32 of the capacitor 30 is connected to the second electric wire 22H and a second terminal 33 of the capacitor 30 is connected to the first electric wire 22L. The capacitor 30 is connected in parallel with the series-connected switching elements 23 and 24.

As the switching elements 23 and 24, for example, N-type MOSFETs (metal oxide semiconductor field-effect transistors) can be used.

As illustrated in FIG. 1, the inductor 21 is mounted on the first main surface 11a of the substrate 11 via, for example, a pair of terminal electrodes 21a and 21b and the connection pin 21c.

Figure 2:
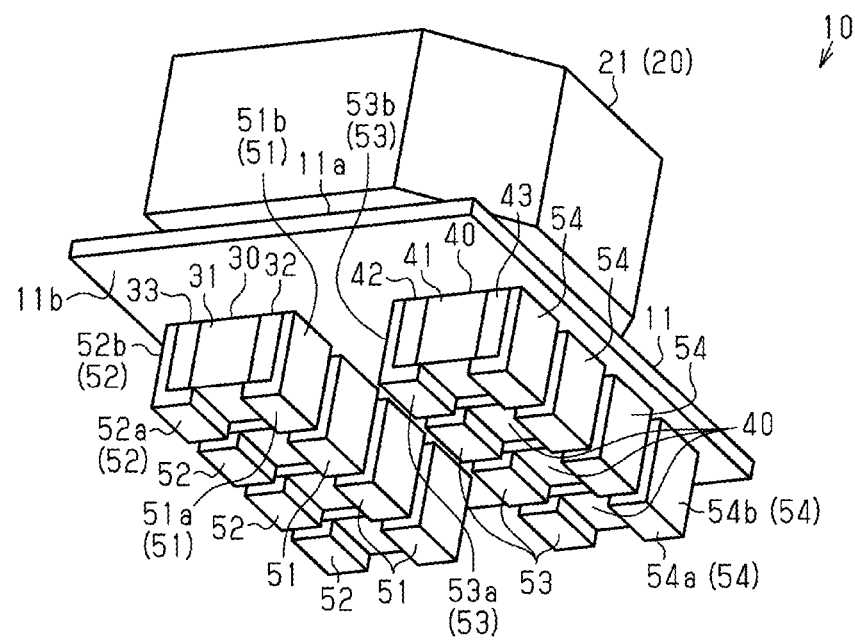
FIG. 2 is a perspective view of the circuit module according to the first preferred embodiment of the present invention with no sealing resin.

As illustrated in FIGS. 1 and 2, the capacitors 30 and 40 have a rectangular or substantially rectangular parallelepiped shape extending in one direction. As the capacitors 30 and 40, multilayer ceramic capacitors, for example, can be used. By using multilayer ceramic capacitors, for example, a lower ESR (equivalent series resistance) and a lower ESL (equivalent series inductance) can be achieved as compared with the case where another type of capacitors are used.

As illustrated in FIG. 2, the multiple (for example, four in the present preferred embodiment) capacitors 30 and the multiple (for example, four in the present preferred embodiment) capacitors 40 are provided. The capacitor 30 is an output-side capacitor when the circuit module 10 performs a voltage step-up operation and is an input-side capacitor when the circuit module 10 performs a voltage step-down operation. The capacitor 40 is an input-side capacitor when the circuit module 10 performs a voltage step-up operation and is an output-side capacitor when the circuit module 10 performs a voltage step-down operation.

As illustrated in FIGS. 1 and 2, the capacitors 30 and the capacitors 40 are spaced apart from each other on the second main surface 11b. The sealing resin 12 is provided between the capacitors 30 and the capacitors 40.

As illustrated in FIGS. 1 and 2, the capacitor 30 includes a multilayer body 31, the first terminal 32, and the second terminal 33, and the capacitor 40 includes a multilayer body 41, the first terminal 42, and the second terminal 43. Each of the multilayer bodies 31 and 41 is obtained by laminating, for example, a sandwich of a plurality of ceramic layers and internal electrodes (not illustrated).

The first terminal 32 is provided on a first end surface 31a of the multilayer body 31 to be electrically connected to a portion of the internal electrode. The second terminal 33 is provided on a second end surface 31b of the multilayer body 31 to be electrically connected to a portion of the internal electrode. The internal electrode to which the first terminal 32 is connected is not connected to the second terminal 33, and the internal electrode to which the second terminal 33 is connected is not connected to the first terminal 32.

Each of the first terminal 32 and the second terminal 33 includes an upper electrode portion 34, a lower electrode portion 35, and a side-surface electrode portion 36. The upper electrode portion 34 is in contact with the multilayer body 31 on the upper side of the multilayer body 31 and faces the second main surface lib of the substrate 11. The upper electrode portion 34 is connected to the connection electrode 11d provided on the side of the second main surface 11b. The lower electrode portion 35 is in contact with the multilayer body 31 on the lower side of the multilayer body 31 and faces opposite from the upper electrode portion 34. The side-surface electrode portion 36 is in contact with the end surfaces 31a and 31b of the multilayer body 31 to connect the upper electrode portion 34 and the lower electrode portion 35. The upper electrode portion 34 according to the present preferred embodiment corresponds to a first electrode portion. The lower electrode portion 35 corresponds to a second electrode portion. The side-surface electrode portion 36 corresponds to a third electrode portion.

The first terminal 42 is provided on a first end surface 41a of the multilayer body 41 to be electrically connected to a portion of the internal electrode. The second terminal 43 is provided on a second end surface 41b of the multilayer body 41 to be electrically connected to a portion of the internal electrode. The internal electrode to which the first terminal 42 is connected is not connected to the second terminal 43, and the internal electrode to which the second terminal 43 is connected is not connected to the first terminal 42.

Each of the first terminal 42 and the second terminal 43 includes an upper electrode portion 44, a lower electrode portion 45, and a side-surface electrode portion 46. The upper electrode portion 44 is in contact with the multilayer body 41 on the upper side of the multilayer body 41 and faces the second main surface lib of the substrate 11. The upper electrode portion 44 is connected to the connection electrode 11d provided on the side of the second main surface 11b. The lower electrode portion 45 is in contact with the multilayer body 31 on the lower side of the multilayer body 31 and faces opposite from the upper electrode portion 44. The side-surface electrode portion 46 is in contact with the end surfaces 41a and 41b of the multilayer body 41 to connect the upper electrode portion 44 and the lower electrode portion 45. The upper electrode portion 44 according to the present preferred embodiment corresponds to the first electrode portion. The lower electrode portion 45 corresponds to the second electrode portion. The side-surface electrode portion 46 corresponds to the third electrode portion.

As illustrated in FIGS. 1 and 2, the circuit module 10 according to the present preferred embodiment includes metal plates 51, 52, 53, and 54. The metal plates 51, 52, 53, and 54 are conductors made of, for example, copper. The multiple (for example, four) metal plates 51 and the multiple (for example, four) metal plates 52 are provided to correspond to the respective multiple capacitors 30. The multiple (for example, four) metal plates 53 and the multiple (for example, four) metal plates 54 are provided to correspond to the respective multiple capacitors 40. The metal plates 51 and 52 are output-side metal plates when the circuit module 10 performs a voltage step-up operation and are input-side metal plates when the circuit module 10 performs a voltage step-down operation. The metal plates 53 and 54 are input-side metal plates when the circuit module 10 performs a voltage step-up operation and are output-side metal plates when the circuit module 10 performs a voltage step-down operation.

The metal plate 51 is in contact with the lower electrode portion 35 and the side-surface electrode portion 36 of the first terminal 32. More specifically, the metal plate 51 includes a first plate portion 51a in contact with the lower electrode portion 35 and a second plate portion 51b in contact with the side-surface electrode portion 36 and has a substantially L-shaped cross section. The first plate portion 51a is in contact with the lower electrode portion 35 to cover the entirety or substantially the entirety of the lower electrode portion 35. The second plate portion 51b is in contact with the side-surface electrode portion 36 to cover the entirety or substantially the entirety of the side-surface electrode portion 36. The second plate portion 51b is coupled to the first plate portion 51a on the lower-end side thereof. An upper end surface 51c of the second plate portion 51b is connected to the connection electrode 11d to which the upper electrode portion 34 of the first terminal 32 is electrically connected.

The metal plate 52 is in contact with the lower electrode portion 35 and the side-surface electrode portion 36 of the second terminal 33. More specifically, the metal plate 52 includes a first plate portion 52a in contact with the lower electrode portion 35 and a second plate portion 52b in contact with the side-surface electrode portion 36 and has a substantially L-shaped cross section. The first plate portion 52a is in contact with the lower electrode portion 35 to cover the entirety or substantially the entirety of the lower electrode portion 35. The second plate portion 52b is in contact with the side-surface electrode portion 36 to cover the entirety or substantially the entirety of the side-surface electrode portion 36. The second plate portion 52b is coupled to the first plate portion 52a on the lower-end side thereof. An upper end surface 52c of the second plate portion 52b is connected to the connection electrode 11d to which the upper electrode portion 34 of the second terminal 33 is electrically connected.

The metal plate 53 is in contact with the lower electrode portion 45 and the side-surface electrode portion 46 of the first terminal 42. More specifically, the metal plate 53 includes a first plate portion 53a in contact with the lower electrode portion 45 and a second plate portion 53b in contact with the side-surface electrode portion 46 and has a substantially L-shaped cross section. The first plate portion 53a is in contact with the lower electrode portion 45 to cover the entirety or substantially an entirety of the lower electrode portion 45. The second plate portion 53b is in contact with the side-surface electrode portion 46 to cover the entirety or substantially an entirety of the side-surface electrode portion 46. The second plate portion 53b is coupled to the first plate portion 53a on the lower-end side thereof. An upper end surface 53c of the second plate portion 53b is connected to the connection electrode 11d to which the upper electrode portion 44 of the first terminal 42 is electrically connected.

The metal plate 54 is in contact with the lower electrode portion 45 and the side-surface electrode portion 46 of the second terminal 43. More specifically, the metal plate 54 includes a first plate portion 54a in contact with the lower electrode portion 45 and a second plate portion 54b in contact with the side-surface electrode portion 46 and has a substantially L-shaped cross section. The first plate portion 54a is in contact with the lower electrode portion 45 to cover the entirety or substantially the entirety of the lower electrode portion 45. The second plate portion 54b is in contact with the side-surface electrode portion 46 to cover the entirety or substantially the entirety of the side-surface electrode portion 46. The second plate portion 54b is coupled to the first plate portion 54a on the lower-end side thereof. An upper end surface 54c of the second plate portion 54b is connected to the connection electrode 11d to which the upper electrode portion 44 of the second terminal 43 is electrically connected.

The first plate portions 51a, 52a, 53a, and 54a of the metal plates 51, 52, 53, and 54 are exposed at the sealing resin 12.

As illustrated in FIG. 1, the sealing resin 12 seals various electronic components including the inductor 21 in the DC/DC converter circuit 20 in the circuit module 10. The sealing resin 12 seals the capacitors 30 and 40 and parts of the metal plates 51, 52, 53, and 54. More specifically, the sealing resin 12 is provided such that the first plate portions 51a, 52a, 53a, and 54a of the metal plates 51, 52, 53, and 54 are exposed. The sealing resin 12 covers the first main surface 11a and the second main surface 11b of the substrate 11 to seal the first main surface 11a and the second main surface 11b. In the circuit module 10 according to the present preferred embodiment, the sealing resin may be provided such that, for example, the entirety or substantially the entirety of the circuit module including the first plate portions 51a, 52a, 53a, and 54a is sealed with resin and the first plate portions 51a, 52a, 53a, and 54a are exposed using a grind method.

Next, the operation of the present preferred embodiment will be described.

The circuit module 10 according to the present preferred embodiment is a power module that includes the DC/DC converter circuit 20 and causes the DC/DC converter circuit 20 to step up or down a voltage. The first plate portions 51a, 52a, 53a, and 54a of the metal plates 51, 52, 53, and 54 in the circuit module 10 are exposed to the outside. That is, the metal plates 51, 52, 53, and 54 (the first plate portions 51a, 52a, 53a, and 54a) define and function as input/output terminals (metal terminals) for connecting the circuit module 10 to another electric apparatus.

The second plate portions 51b and 52b of the metal plates 51 and 52 are in contact with the side-surface electrode portion 36 of the capacitor 30 and the connection electrode 11d to which the upper electrode portion 34 is connected. The second plate portions 53b and 54b of the metal plates 53 and 54 are in contact with the side-surface electrode portion 46 of the capacitor 40 and the connection electrode 11d to which the upper electrode portion 44 is connected. Accordingly, the second plate portions 51b, 52b, 53b, and 54b and the side-surface electrode portions 36 and 46 define a conduction path. By using the second plate portions 51*b*, 52*b*, 53*b*, and 54*b* in addition to the side-surface electrode portions 36 and 46, an allowable current can be increased.

In the case where the capacitors 30 and 40 are used as the input/output terminals of the circuit module 10, an allowable current is limited because of the thickness of the side-surface electrode portions 36 and 46 of the capacitors 30 and 40. When a large current flows through the side-surface electrode portions 36 and 46, heat is easily generated. As described above, the generation of heat can be reduced or prevented by increasing an allowable current using the second plate portions 51*b*, 52*b*, 53*b*, and 54*b* in addition to the side-surface electrode portions 36 and 46. Furthermore, the second plate portions 51*b*, 52*b*, 53*b*, and 54*b* can contribute to the improvement of a heat dissipation effect.

A non-limiting example of a method is considered to form the sealing resin 12 such that the entirety or substantially the entirety of the circuit module 10 is sealed with resin and the first plate portions 51*a*, 52*a*, 53*a*, and 54*a* defining and functioning as input/output terminals are exposed using a grind method. At that time, since the lower electrode portion 35 of the capacitor 30 is covered by the first plate portions 51*a* and 52*a* and the lower electrode portion 45 of the capacitor 40 is covered by the first plate portions 53*a* and 54*a*, the lower electrode portions 35 and 45 are prevented from being grinded. This leads to a reduction or prevention of the degradation in the characteristics of the capacitors 30 and 40.

According to the present preferred embodiment described above, the following advantageous effects can be obtained.

(1-1) The metal plates 51, 52, 53, and 54, which are in contact with the lower electrode portions 35 and 45 and the side-surface electrode portions 36 and 46 of the capacitors 30 and 40, are connected to the substrate 11, and are exposed to the outside, can be used as terminals for the connection to the outside. An allowable current can be increased with the metal plates 51, 52, 53, and 54 that are in contact with the lower electrode portions 35 and 45 as compared with the case where the capacitors 30 and 40 are used as terminals. Accordingly, the heat generation of the capacitors 30 and 40 can be reduced or prevented.

(1-2) By providing the metal plates 51, 52, 53, and 54 at both the capacitors 30 and 40, the metal plates 51, 52, 53, and 54 can be used as the input terminal and output terminal of the circuit module 10.

Second Preferred Embodiment

A circuit module according to a second preferred embodiment of the present invention will be described with reference to FIG. 4. A circuit module according to the present preferred embodiment differs from the circuit module according to the first preferred embodiment in the structure of metal plates. In the following description, the same reference numerals are used to represent the components common to those in the first preferred embodiment, and the description thereof will be entirely or partly omitted.

Figure 4:
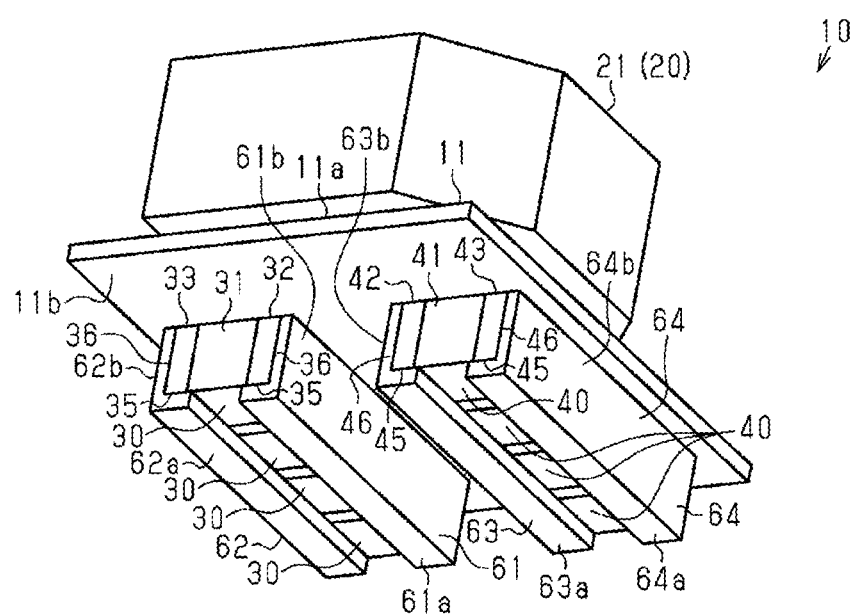
FIG. 4 is a perspective view of a circuit module according to a second preferred embodiment of the present invention with no sealing resin.

As illustrated in FIG. 4, the multiple (for example, four in the present preferred embodiment) capacitors 30 and the multiple (for example, four in the present preferred embodiment) capacitors 40 in the circuit module 10 according to the present preferred embodiment are provided as in the first preferred embodiment. The circuit module 10 according to the present preferred embodiment includes metal plates 61, 62, 63, and 64.

Each of the metal plates 61 and 62 straddles the multiple capacitors 30. Each of the metal plates 63 and 64 straddles the multiple capacitors 40.

The metal plate 61 is in contact with the lower electrode portions 35 and the side-surface electrode portions 36 of the first terminals 32 of the respective capacitors 30. More specifically, the metal plate 61 includes a first plate portion 61*a* in contact with the respective lower electrode portions 35 and a second plate portion 61*b* in contact with the respective side-surface electrode portions 36 and has a substantially L-shaped cross section. The metal plate 61 extends in a direction in which the multiple capacitors 30 are arranged.

The metal plate 62 is in contact with the lower electrode portions 35 and the side-surface electrode portions 36 of the second terminals 33 of the respective capacitors 30. More specifically, the metal plate 62 includes a first plate portion 62*a* in contact with the respective lower electrode portions 35 and a second plate portion 62*b* in contact with the respective side-surface electrode portions 36 and has a substantially L-shaped cross section. The metal plate 62 extends in the direction in which the multiple capacitors 30 are arranged.

The metal plate 63 is in contact with the lower electrode portions 45 and the side-surface electrode portions 46 of the first terminals 42 of the respective capacitors 40. More specifically, the metal plate 63 includes a first plate portion 63*a* in contact with the respective lower electrode portions 45 and a second plate portion 63*b* in contact with the respective side-surface electrode portions 46 and has a substantially L-shaped cross section. The metal plate 63 extends in a direction in which the multiple capacitors 40 are arranged.

The metal plate 64 is in contact with the lower electrode portions 45 and the side-surface electrode portions 46 of the second terminals 43 of the respective capacitors 40. More specifically, the metal plate 64 includes a first plate portion 64*a* in contact with the respective lower electrode portions 45 and a second plate portion 64*b* in contact with the respective side-surface electrode portions 46 and has a substantially L-shaped cross section. The metal plate 64 extends in the direction in which the multiple capacitors 40 are arranged.

According to the present preferred embodiment described above, the following advantageous effects can be obtained.

(2-1) Since the metal plates 61 and 62 straddle the multiple capacitors 30 and the metal plates 63 and 64 straddle the multiple capacitors 40, a localized current convergence can be reduced or prevented and localized heat generation can be reduced or prevented.

Other Preferred Embodiments

The above preferred embodiments may be modified and achieved as described below. The above preferred embodiments and the modified examples to be described below may be combined with each other and achieved within the bounds of not causing a technical contradiction.

Although the sealing resin 12 is located between the capacitors 30 and 40 in the above preferred embodiments, the present invention is not limited thereto.

Figure 5:
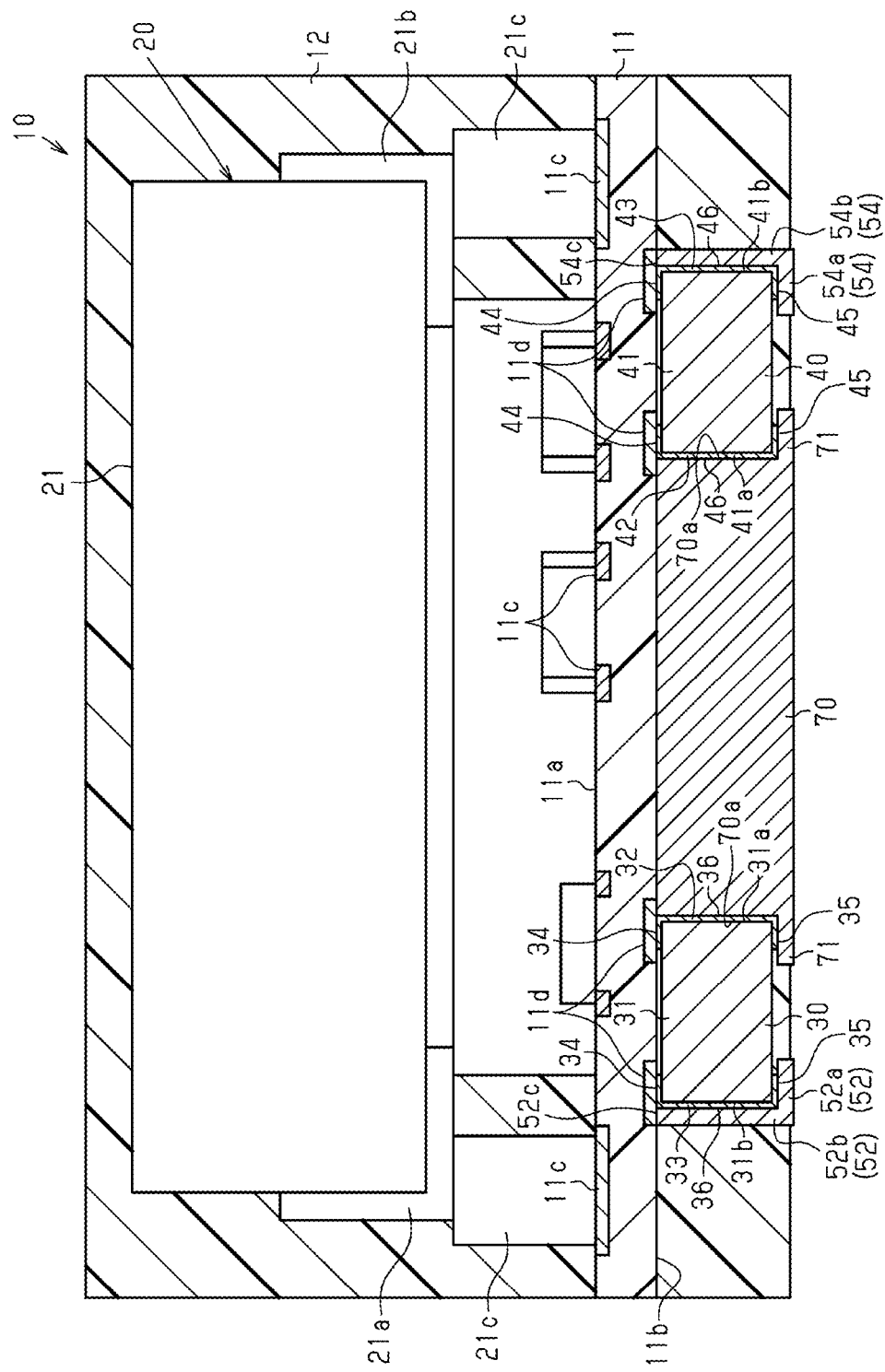
FIG. 5 is a cross-sectional view of a circuit module according to a modification of a preferred embodiment of the present invention.

As illustrated in FIG. 5, a structure may be provided in which an intermediate metal plate 70 is provided between the capacitors 30 and 40. A side surface 70*a* of the intermediate metal plate 70 is in contact with the side-surface electrode portion 36 of the first terminal 32 of the capacitor 30 and the side-surface electrode portion 46 of the first terminal 42 of the capacitor 40. The intermediate metal plate 70 includes a pair of extended portions 71 extending in a direction orthogonal or substantially orthogonal to the side surface 70a in the bottom portion thereof. A pair of the extended portions 71 are in contact with the lower electrode portion 35 of the first terminal 32 of the capacitor 30 and the lower electrode portion 45 of the first terminal 42 of the capacitor 40 to cover the entirety or substantially the entirety of the lower electrode portions 35 and 45. That is, the first terminal 32 of the capacitor 30 and the first terminal 42 of the capacitor 40 are electrically connected via the intermediate metal plate 70. In the exemplary structure illustrated in FIG. 5, the metal plate 51 and the metal plate 53 in the first preferred embodiment are not provided, that is, the intermediate metal plate 70 is in contact with the first terminal 32 of the capacitor 30 and the first terminal 42 of the capacitor 40. However, the present invention is not limited thereto. That is, a structure may be provided in which the intermediate metal plate 70 is electrically connected to the first terminal 32 of the capacitor 30 and the first terminal 42 of the capacitor 40 via the metal plates 51 and 53, respectively. In this case in which the metal plates 51 and 53 are provided, the intermediate metal plate 70 is in contact with the first terminal 32 of the capacitor 30 and the first terminal 42 of the capacitor 40.

With the above structure, the intermediate metal plate 70 can dissipate heat and heat generation can be suitably reduced or prevented.

Figure 6:
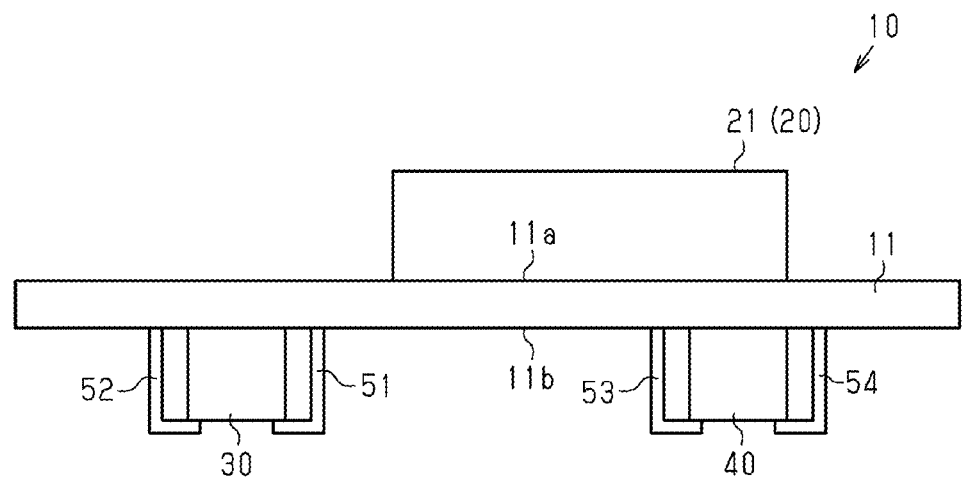
FIG. 6 is a side view of a circuit module according to a modification of a preferred embodiment of the present invention which illustrates the schematic configuration of the circuit module.

As illustrated in FIG. 6, a structure may be provided in which the inductor 21 is closer to one of the capacitors (the capacitor 40). The capacitor 40 is connected to the inductor 21 via the third electric wire 22M. In this case, the wiring path (the third electric wire 22M) between the inductor 21 and the capacitor 40 can be shortened. Accordingly, the values of a direct-current resistance and a parasitic inductance generated at the third electric wire 22M can be reduced and a generated ripple voltage can be reduced.

The number of the capacitors 30 and the number of the capacitors 40 are, for example, four in the above preferred embodiments, but may be three or less or five or more. The number of the capacitors 30 and the number of the capacitors 40 may be different.

In the above preferred embodiments, both of the capacitors 30 and 40 are provided with the metal plates 51 and 52 and the metal plates 53 and 54, respectively. However, a structure may be provided in which only one of the capacitors 30 and 40 is provided with metal plates.

In the above preferred embodiments, the DC/DC converter circuit 20 performs a voltage step-up operation and a voltage step-down operation. However, the DC/DC converter circuit 20 may perform only one of them.

Reference Example

Next, a reference example of a preferred embodiment of the present invention will be described with reference to FIGS. 7 and 8. In the following description, the same reference numerals are used to represent the components common to those in the preferred embodiments, and the description thereof will be entirely or partly omitted. The following preferred embodiment exemplifies a configuration and method embodying the technical idea, and do not limit a material, a shape, a structure, an arrangement, a dimension, and the like of each component. Various modifications may be made to the following preferred embodiment.

Figure 7:
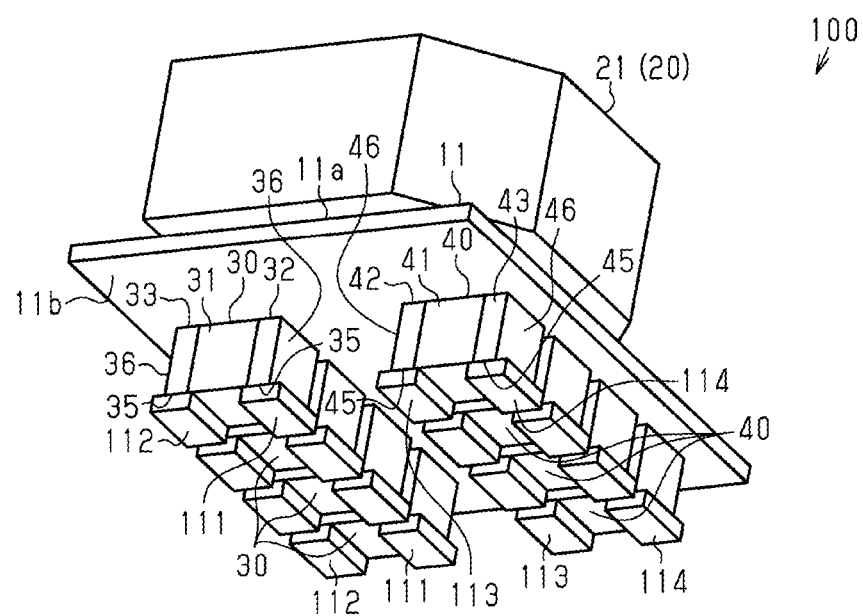
FIG. 7 is a perspective view of a circuit module according to a reference example with no sealing resin.
Figure 8:
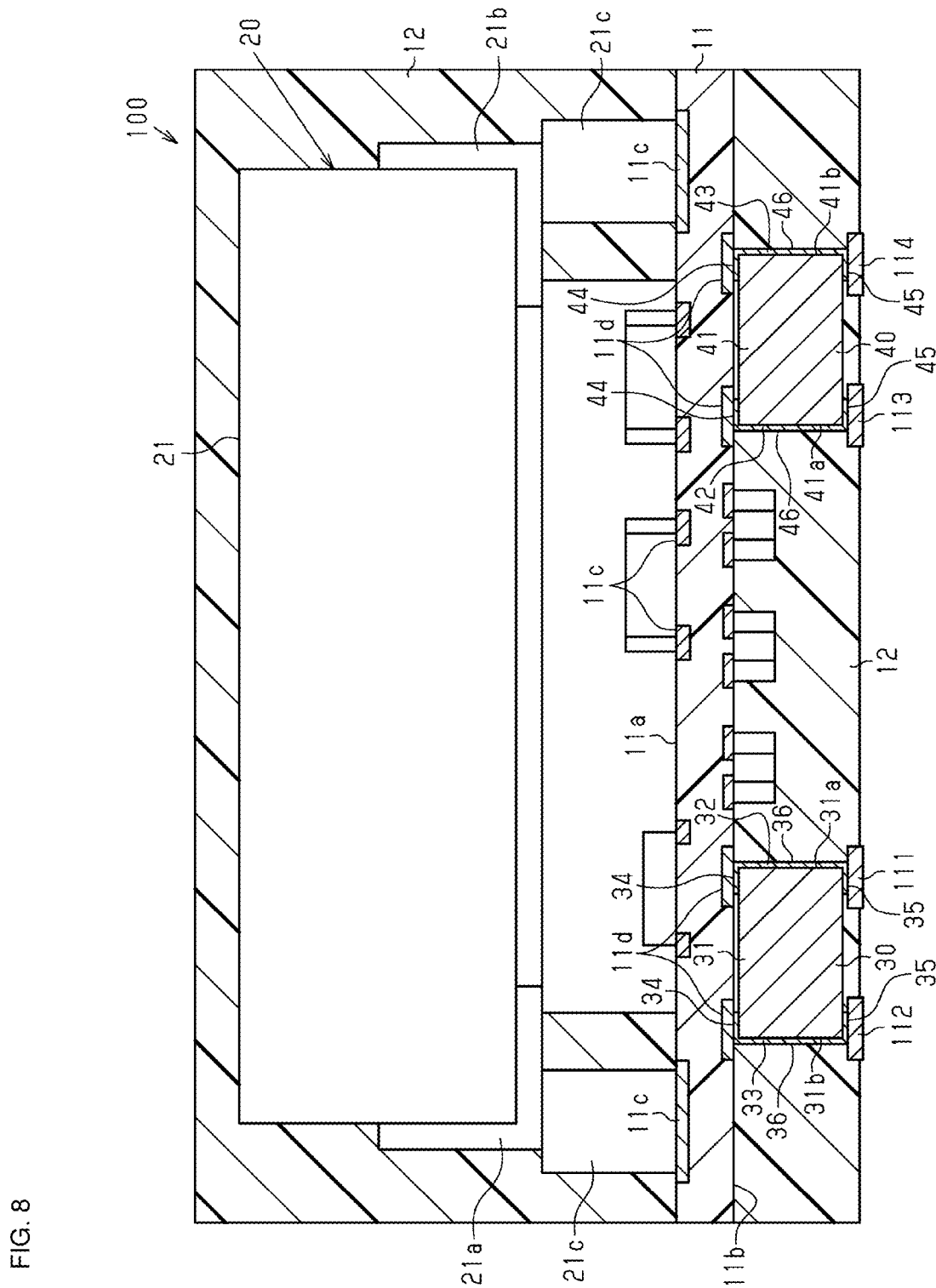
FIG. 8 is a cross-sectional view of a circuit module according to the reference example of a preferred embodiment of the present invention.

Note that some components may be illustrated in an enlarged manner in FIGS. 7 and 8 for ease of understanding. The dimensional ratios of the components may be different from the dimensional ratios of actual components or may differ between those in the drawings. In a cross-sectional view, hatching may be omitted for some of the components for ease of understanding.

As illustrated in FIGS. 7 and 8, a circuit module 100 according to the present preferred embodiment includes the substrate 11, the DC/DC converter circuit 20 including the inductor 21, the multiple capacitors 30 and 40, and the sealing resin 12 as in the first preferred embodiment. The circuit module 100 according to the present preferred embodiment is a power module for stepping up or down a voltage using the DC/DC converter circuit 20.

The circuit module 100 includes metal plates 111, 112, 113, and 114. The metal plates 111, 112, 113, and 114 are conductors made of, for example, copper. The multiple (for example, four) metal plates 111 and the multiple (for example, four) metal plates 112 are provided to correspond to the respective multiple capacitors 30. The multiple (for example, four) metal plates 113 and the multiple (for example, four) metal plates 114 are provided to correspond to the respective multiple capacitors 40.

The metal plate 111 is in contact with the lower electrode portion 35 of the first terminal 32 to cover the entirety or substantially the entirety of the lower electrode portion 35. The metal plate 112 is in contact with the lower electrode portion 35 of the second terminal 33 to cover the entirety or substantially the entirety of the lower electrode portion 35. The metal plate 113 is in contact with the lower electrode portion 45 of the first terminal 42 to cover the entirety or substantially the entirety of the lower electrode portion 45. The metal plate 114 is in contact with the lower electrode portion 45 of the second terminal 43 to cover the entirety or substantially the entirety of the lower electrode portion 45.

As illustrated in FIG. 8, the sealing resin 12 seals various electronic components including the inductor 21 in the DC/DC converter circuit 20 in the circuit module 100. The sealing resin 12 seals the capacitors 30 and 40 and portions of the metal plates 111, 112, 113, and 114. More specifically, the sealing resin 12 is provided such that the bottom portions of the metal plates 111, 112, 113, and 114 are exposed. The sealing resin 12 covers the first main surface 11a and the second main surface 11b of the substrate 11 to seal the first main surface 11a and the second main surface 11b. In the circuit module 100 according to the present preferred embodiment, the sealing resin 12 may be provided such that, for example, the entirety or substantially the entirety of the circuit module including the metal plates 111, 112, 113, and 114 is sealed with resin and the portions (bottom portions) of the metal plates 111, 112, 113, and 114 are exposed using a grind method.

Next, the operation of the present preferred embodiment will be described.

The circuit module 100 according to the present preferred embodiment is a power module that includes the DC/DC converter circuit 20 and causes the DC/DC converter circuit 20 to step up or down a voltage. The metal plates 111, 112, 113, and 114 in the circuit module 10 are exposed to the outside. That is, the metal plates 111, 112, 113, and 114 define and function as input/output terminals (metal terminals) to connect the circuit module 100 to another electric apparatus.

A non-limiting example of a method is considered of forming the sealing resin 12 such that the entirety or substantially the entirety of the circuit module 100 is sealed with resin and the metal plates 111, 112, 113, and 114 defining and functioning as input/output terminals are exposed using a grind method. At that time, since the lower electrode portion 35 of the capacitor 30 is covered by the metal plates 111 and 112 and the lower electrode portion 45 of the capacitor 40 is covered by the metal plates 113 and 114, the lower electrode portions 35 and 45 are prevented from being grinded. This leads to the reduction or prevention of the degradation in the characteristics of the capacitors 30 and 40.

In the above reference example, the metal plates 111 and 112 are provided for each of the capacitors 30 and the metal plates 113 and 114 are provided for each of the capacitors 40. However, the present invention is not limited thereto. As in the second preferred embodiment, metal plates may straddle the multiple capacitors 30 and metal plates may straddle the multiple capacitors 40.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a substrate including a first main surface and a second main surface;
a DC/DC converter circuit mounted on the first main surface of the substrate;
a capacitor mounted on the second main surface of the substrate and including a pair of electrodes each including a first electrode portion, a second electrode portion, and a third electrode portion, the first electrode portion facing the second main surface and being connected to the DC/DC converter circuit via the substrate, the second electrode portion opposing the first electrode portion, the third electrode portion connecting the first electrode portion and the second electrode portion; and
a metal plate connected to the substrate, in contact with the second electrode portion and the third electrode portion, and at least partly exposed to an outside.

2. The circuit module according to claim 1, wherein
the capacitor includes an input-side capacitor electrically connected to an input side of the DC/DC converter circuit and an output-side capacitor electrically connected to an output side of the DC/DC converter circuit; and
the metal plate includes an input-side metal plate in contact with the second and third electrode portions of the input-side capacitor and an output-side metal plate in contact with the second and third electrode portions of the output-side capacitor.

3. The circuit module according to claim 2,
a plurality of the input-side capacitors and a plurality of the output-side capacitors are mounted on the second main surface; and
the input-side metal plate straddles the plurality of input-side capacitors, and the output-side metal plate straddles the plurality of output-side capacitors.

4. The circuit module according to claim 2,
the third electrode portion of the input-side capacitor and the third electrode portion of the output-side capacitor face each other; and
the circuit module includes an intermediate metal plate in contact with the third electrode portion of the input-side capacitor and the third electrode portion of the output-side capacitor.

5. The circuit module according to claim 1, wherein
the DC/DC converter circuit includes first, second, and third electric wires and two switches;
the two switches are connected in series between the first and second electric wires; and
a connection node between the two switches is connected to the third electric wire.

6. The circuit module according to claim 5, wherein each of the two switches is an N-type metal oxide semiconductor field-effect transistor.

7. The circuit module according to claim 2, further comprising a sealing resin between the input-side capacitor and the output-side capacitor.

8. The circuit module according to claim 1, wherein the capacitor includes a multilayer body, and the pair of electrodes are provided on a respective end surface of the multilayer body.

9. The circuit module according to claim 1, wherein the metal plate is made of copper.

10. The circuit module according to claim 2, wherein each of the input-side metal plate and the output-side metal plate is made of copper.

11. The circuit module according to claim 1, wherein the metal plate has a substantially L-shaped cross section.

12. The circuit module according to claim 1, wherein each of the input-side metal plate and the output-side metal plate has a substantially L-shaped cross section.

13. The circuit module according to claim 1, wherein the metal plate covers an entirety or substantially an entirety of the second electrode portion.

14. The circuit module according to claim 1, wherein the metal plate covers an entirety or substantially an entirety of the third electrode portion.

15. The circuit module according to claim 2, wherein
the input-side metal plate covers an entirety or substantially an entirety of the second electrode portion of the input-side capacitor; and
the output-side metal plate covers an entirety or substantially an entirety of the second electrode portion of the output-side capacitor.

16. The circuit module according to claim 2, wherein
the input-side metal plate covers an entirety or substantially an entirety of the third electrode portion of the input-side capacitor; and
the output-side metal plate covers an entirety or substantially an entirety of the third electrode portion of the output-side capacitor.

* * * * *